(12) United States Patent
Panseri et al.

(10) Patent No.: US 11,239,799 B2
(45) Date of Patent: Feb. 1, 2022

(54) APPARATUS FOR RADIO-FREQUENCY AMPLIFIER WITH IMPROVED PERFORMANCE AND ASSOCIATED METHODS

(71) Applicant: Silicon Laboratories Inc., Austin, TX (US)

(72) Inventors: Luigi Panseri, Austin, TX (US); Mustafa H. Koroglu, Austin, TX (US); Praveen Vangala, Austin, TX (US); John M. Khoury, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/661,174

(22) Filed: Oct. 23, 2019

(65) Prior Publication Data

US 2021/0126587 A1    Apr. 29, 2021

(51) Int. Cl.
*H03F 1/02* (2006.01)
*H03F 3/24* (2006.01)
*H04B 1/40* (2015.01)
*H03F 1/32* (2006.01)

(52) U.S. Cl.
CPC ......... *H03F 1/0216* (2013.01); *H03F 1/3205* (2013.01); *H03F 3/245* (2013.01); *H04B 1/40* (2013.01); *H03F 2200/451* (2013.01); *H03F 2201/3215* (2013.01)

(58) Field of Classification Search
CPC .................................................. H03F 1/0216
See application file for complete search history.

(56) References Cited

U.S. PATENT DOCUMENTS

| | | | | |
|---|---|---|---|---|
| 7,288,987 B2 * | 10/2007 | Carichner | ............. | H03F 1/0205 330/124 R |
| 9,450,622 B2 * | 9/2016 | Menkhoff | ............. | H03F 1/3241 |
| 9,755,585 B1 * | 9/2017 | Klein | ...................... | H03F 3/193 |
| 10,727,883 B2 * | 7/2020 | Demenitroux | ....... | H04B 1/0064 |
| 2011/0183636 A1 * | 7/2011 | Staudinger | ............ | H03F 1/0222 455/102 |
| 2015/0031318 A1 * | 1/2015 | McCallister | .......... | H03F 1/0222 455/114.3 |
| 2017/0338773 A1 * | 11/2017 | Balteanu | ............... | H03F 1/0277 |
| 2020/0343865 A1 * | 10/2020 | Balteanu | ................. | H03F 3/245 |

* cited by examiner

*Primary Examiner* — Patricia T Nguyen
(74) *Attorney, Agent, or Firm* — Law Offices of Maximilian R. Peterson

(57) ABSTRACT

An apparatus includes a radio-frequency (RF) circuit, which includes a power amplifier coupled to receive an RF input signal and to provide an RF output signal in response to a modified bias signal. The RF circuit further includes a bias path circuit coupled to modify a bias signal as a function of a characteristic of an input signal to generate the modified bias signal. The bias path circuit provides the modified bias signal to the power amplifier.

20 Claims, 15 Drawing Sheets

APPARATUS FOR RADIO-FREQUENCY AMPLIFIER WITH IMPROVED PERFORMANCE AND ASSOCIATED METHODS

TECHNICAL FIELD

The disclosure relates generally to amplifiers and, more particularly, to apparatus for power amplifiers (PAs) with improved performance, and associated methods.

BACKGROUND

With the increasing proliferation of wireless technology, such as Wi-Fi, Bluetooth, and mobile or wireless Internet of things (IoT) devices, more devices or systems incorporate RF circuitry, such as receivers and/or transmitters. To reduce the cost, size, and bill of materials, and to increase the reliability of such devices or systems, various circuits or functions have been integrated into integrated circuits (ICs). For example, ICs typically include receiver and/or transmitter circuitry.

With advances in technology, an increasing number of circuit elements have been integrated into devices, such as integrated circuits (ICs). Furthermore, a growing number of devices, such as ICs, or subsystems, have been integrated into products. With developments such as the Internet of Things (IoT), this trend is expected to continue.

The growing number of circuit elements, devices, subsystems, etc., has also resulted in a corresponding increase in the amount of power consumed in the products that include such components. In some applications, such as battery powered, mobile, or portable products, a limited amount of power or energy is available. Given the relatively small amount of power or energy available in such applications, reduced power consumption of the components or products provides advantages or benefits, for example, extending the battery life, increasing the "up-time" or active time of the system, and the like.

Even in non-portable environment, increased power consumption invariably results in larger amounts of generated heat, as the electrical energy is not used 100% efficiently. Thus, reduced power consumption of the components or products provides advantages or benefits, for example, reduced heat amounts, reduced cost of electricity, and the like.

Some IoT devices include radio-frequency (RF) transmitters or transceivers. The transmitters or transceivers typically include an RF power amplifier. The RF power amplifier may in some cases consume a relatively large percentage of the overall power consumption of the device when transmitting RF signals. The efficiency of the RF power amplifier thus affects the overall power efficiency of the device.

The description in this section and any corresponding figure(s) are included as background information materials. The materials in this section should not be considered as an admission that such materials constitute prior art to the present patent application.

SUMMARY

A variety of apparatus and associated methods are contemplated according to exemplary embodiments. According to one exemplary embodiment, an apparatus includes an RF circuit, which includes a power amplifier coupled to receive an RF input signal and to provide an RF output signal in response to a modified bias signal. The RF circuit further includes a bias path circuit coupled to modify a bias signal as a function of a characteristic of an input signal to generate the modified bias signal. The bias path circuit provides the modified bias signal to the power amplifier.

According to another exemplary embodiment, an apparatus includes an RF circuit, which includes a power amplifier coupled to receive an RF input signal and to provide an RF output signal. The RF circuit further includes an intermediate-frequency (IF)/RF path circuit to receive an input signal and provide the RF input signal to the power amplifier. The RF circuit further includes a bias path circuit coupled to generate a bias signal as a function of a characteristic of the input signal, and to provide the bias signal to the power amplifier.

According to another exemplary embodiment, a method of operating a power amplifier includes receiving an input signal, and modifying a bias signal of the power amplifier as a function of a characteristic of the input signal to generate a modified bias signal. The method further includes biasing the power amplifier with the modified bias signal. The method additionally includes amplifying, using the amplifier, the input signal.

BRIEF DESCRIPTION OF THE DRAWINGS

The appended drawings illustrate only exemplary embodiments and therefore should not be considered as limiting the scope of the application or of the claimed subject-matter. Persons of ordinary skill in the art will appreciate that the disclosed concepts lend themselves to other equally effective embodiments. In the drawings, the same numeral designators used in more than one drawing denote the same, similar, or equivalent functionality, components, or blocks.

DETAILED DESCRIPTION

Figure 1:
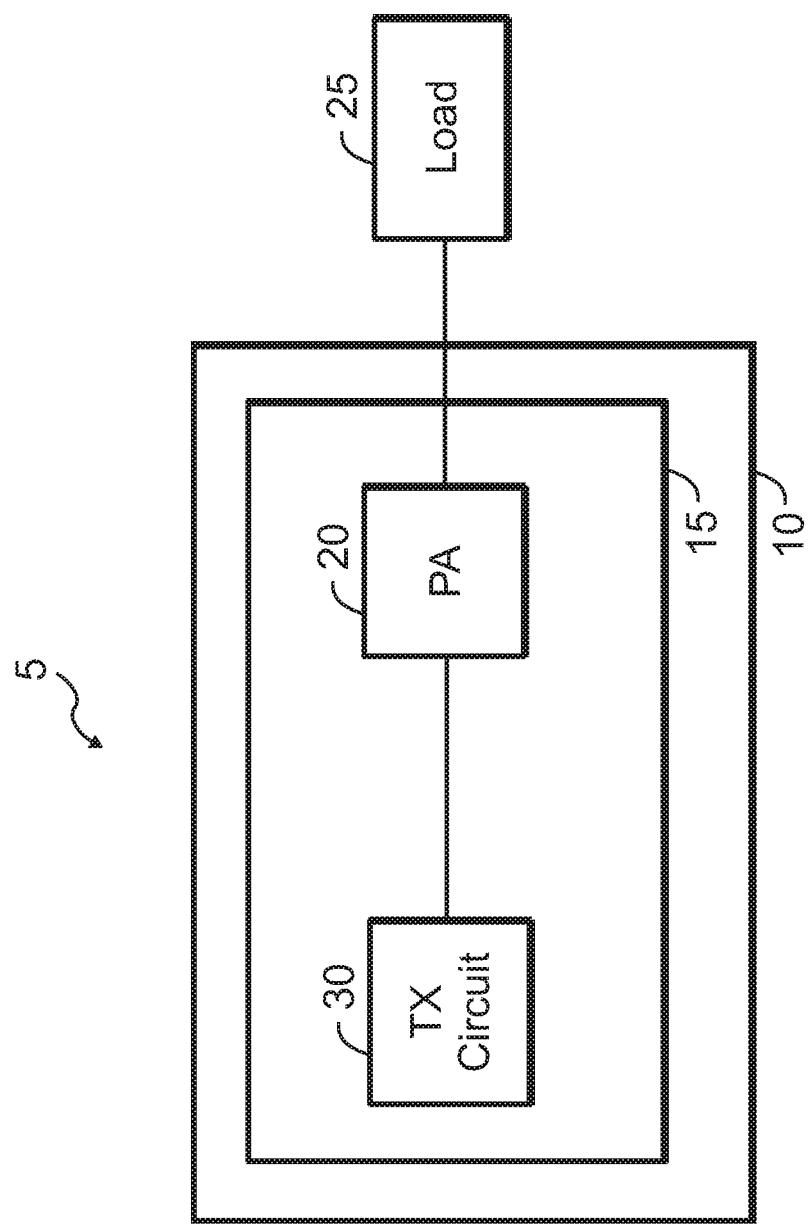
FIG. 1 shows a circuit arrangement including a PA with improved performance according to an exemplary embodiment.

The disclosed concepts relate generally to amplifiers and, more particularly, to RF amplifier apparatus with improved performance, and associated methods. More specifically, the disclosed concepts provide apparatus and methods for RF power amplifiers with improved power efficiency.

In exemplary embodiments, the improved efficiency results from modifying the PA or RF power amplifier (RFPA) bias current (or generating a bias current or, generally, bias signal) as a function of the envelope (e.g., RF envelope) that the PA or RFPA amplifies to generate an amplified RF signal. The PA or RFPA delivers the amplified signal (e.g., an amplified RF signal) to a load, for instance, an antenna (whether directly or through circuitry such as impedance matching circuitry, baluns, etc., as persons of ordinary skill in the art will understand), loudspeakers (in the case of audio amplifiers, discussed below), etc., as persons of ordinary skill in the art will understand.

Although for the sake of brevity the description makes references to bias current(s) and modifying bias current(s), in exemplary embodiments, rather than modifying the bias current (e.g., by modifying one or more constant bias currents), other types of bias signal, such as bias voltage (e.g., by modifying one or more constant bias voltages), or a combination of bias current and voltage may be modified (e.g., by modifying one or more constant bias currents and modifying one or more constant bias voltages) by making appropriate modifications, as persons of ordinary skill in the art will understand. Furthermore, although for the sake of brevity the description makes references to modifying a bias current, bias currents of appropriate level and/or number may be generated as a function of the RF envelope or other attribute (as described below), as persons of ordinary skill in the art will understand. Thus, references to modifying or modification of a bias current (generally bias signal) should be read as encompassing generating a bias current (generally bias signal) as a function of the RF envelope or other attribute.

In exemplary embodiments, rather than modifying the bias current as a function of the envelope of the RF signal, other factors or attributes of the RF signal may be used to modify the bias current, such as amplitude, power, or even in-phase (I) or quadrature (Q) levels in complex-signal systems. For the sake of brevity, references in the disclosure to the RF envelope or the envelope of the RF signal may include or be substituted with such factors or attributes by making appropriate modifications, as persons of ordinary skill in the art will understand.

The techniques can improve the efficiency of the PA or RFPA, for instance this method improves the PA or RFPA efficiency for modulation schemes with linearity that also have relatively high throughput. In exemplary embodiments, the PA or RFPA is linearized by modifying one or more bias currents such that the PA's or RFPA's gain is constant (or relatively constant in a practical, physical implementation, for example, within a given percentage) across power levels of the PA's or RFPA's input signal. The tolerance of the residual error is a function of the signal throughput, modulation scheme, and specified or desired standard or protocol, etc. Typically, the higher the throughput, the higher is the desired or specified linearity, which translates into lower residual error. Although no single number can apply to all situations, standards, specifications, PA designs, etc., typically a number in the about 1% to about 2% range is a reasonable target for gain constancy although, as persons of ordinary skill in the art will understand, other numbers may be desired and may be used. The PAs or RFPAs may include more than one type or source of non-linearity that affects the gain (i.e., make the gain not constant). Merely as examples, and not by way of limitation, in some embodiments, the non-linearities include AM-AM (amplitude to amplitude distortion) and AM-PM (amplitude to phase distortion), as persons of ordinary skill in the art will understand.

In some embodiments, the efficiency improvement and/or linearization are implemented in the analog domain, as described below in detail. In such embodiments, the bias current is continuously modulated.

In some embodiments, the efficiency improvement and/or linearization are implemented in the digital domain, as also described below in detail. In such embodiments, the bias current is modulated by turning on or off segments or slices of the PA or RFPA.

In yet other embodiments, a hybrid solution is implemented, where for certain range(s) of the input signal envelope (e.g., relatively low envelope amplitudes), analog modulation is performed, whereas for other range(s) of the input signal envelope (e.g., relatively high envelope amplitudes), digital modulation is performed. Also, by choosing appropriately the function that relates the bias current and the envelope of the input signal, the linearity of the PA can be improved, still improving further the PA efficiency.

In addition to improved efficiency and linearity, PAs or RFPAs according to exemplary embodiments offer relatively low sensitivity to delay mismatch and quantization errors (in the digital-to-analog (DAC) and look-up table (LUT), described below). Compared to conventional approaches, those attributes make it easier to design, manufacture, and test PAs or RFPAs or systems, subsystems, apparatus, modules, and the like that contain one or more PAs or RFPAs.

Note that, in addition to RFPAs, the techniques described may be applied to any circuit that processes signals with relatively infrequent signal swings of relatively large values (e.g., a peak to average ratio of 3 dB). An example of such a circuit constitutes an audio amplifier. Furthermore, the techniques described may be applied to any circuit that amplifies signals whose amplitude changes over time. Again, an audio amplifier is an example of such a circuit. Although the description makes references to PAs and/or RFPAs, the apparatus and techniques disclosed may be applied to the circuitry described above, as persons of ordinary skill in the art will understand.

RFPAs, or generally PAs (or any other type of circuitry that meets the criteria described above), may be used in a variety of circuitry, systems, subsystems, apparatus, modules, ICs, etc., as persons of ordinary skill in the art will understand.

FIG. 1 shows a circuit arrangement 5 including a PA 20 with improved performance according to an exemplary embodiment. More specifically, the figure shows an apparatus 10 that includes RF circuitry 15. In the embodiment shown, the RF circuitry 15 includes transmit (TX) circuitry 30 coupled to the PA 20. The PA 20 is coupled to, and drives, load 25. In the case of RF circuits or systems, the load 25 may represent or include an antenna, and may include balun, impedance matching circuits, etc., as noted above.

The TX circuitry 30 generates an RF signal for transmission. The TX circuitry 30 may include a variety of circuitry for generating RF signals for transmission, as persons of ordinary skill in the art will understand.

The PA 20 receives the output RF signal of the TX circuitry 30, and amplifies the RF signal to generate an amplified RF signal. The PA 20 includes circuitry to modify the bias current to improve the performance of the PA 20. The PA 20 provides the amplified RF signal to the load 25.

Figure 2:
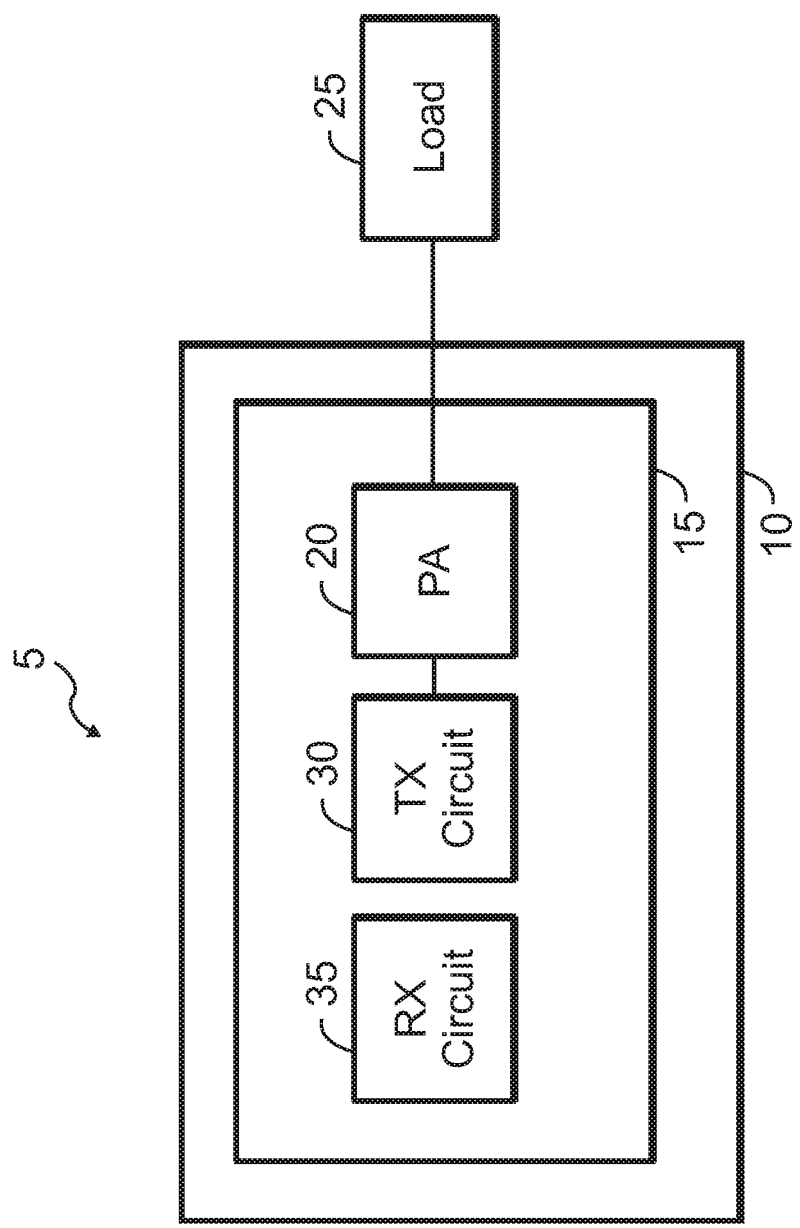
FIG. 2 shows a circuit arrangement including a PA with improved performance according to another exemplary embodiment.

FIG. 2 shows a circuit arrangement 5 including a PA 20 with improved performance according to an exemplary embodiment. More specifically, the figure shows an apparatus 10 that includes RF circuitry 15. In the embodiment shown, the RF circuitry 15 includes both receive (RX) circuitry 35 and transmit (TX) circuitry 30 coupled to the PA 20. The PA 20 is coupled to the load 25. In other words, in the embodiment in FIG. 2, the RF circuitry 15 includes RF transceiver circuitry.

Similar to FIG. 1, the TX circuitry 30 in FIG. 2 generates an RF signal for transmission. The TX circuitry 30 may include a variety of circuitry for generating RF signals for transmission, as persons of ordinary skill in the art will understand.

The PA 20 receives the output RF signal of the TX circuitry 30, and amplifies the RF signal to generate an amplified RF signal. The PA 20 includes circuitry to modify the bias current to improve the performance of the PA 20. The PA 20 provides the amplified RF signal to the load 25.

The RX circuitry 35 may be coupled (using circuitry and devices not shown) to the load 25. Thus, the RX circuitry 35 can receive an RF signal from a medium, such as air or vacuum. The RX circuitry 35 may include a variety of RF signal reception circuitry, as persons of ordinary skill in the art will understand.

Figure 3:
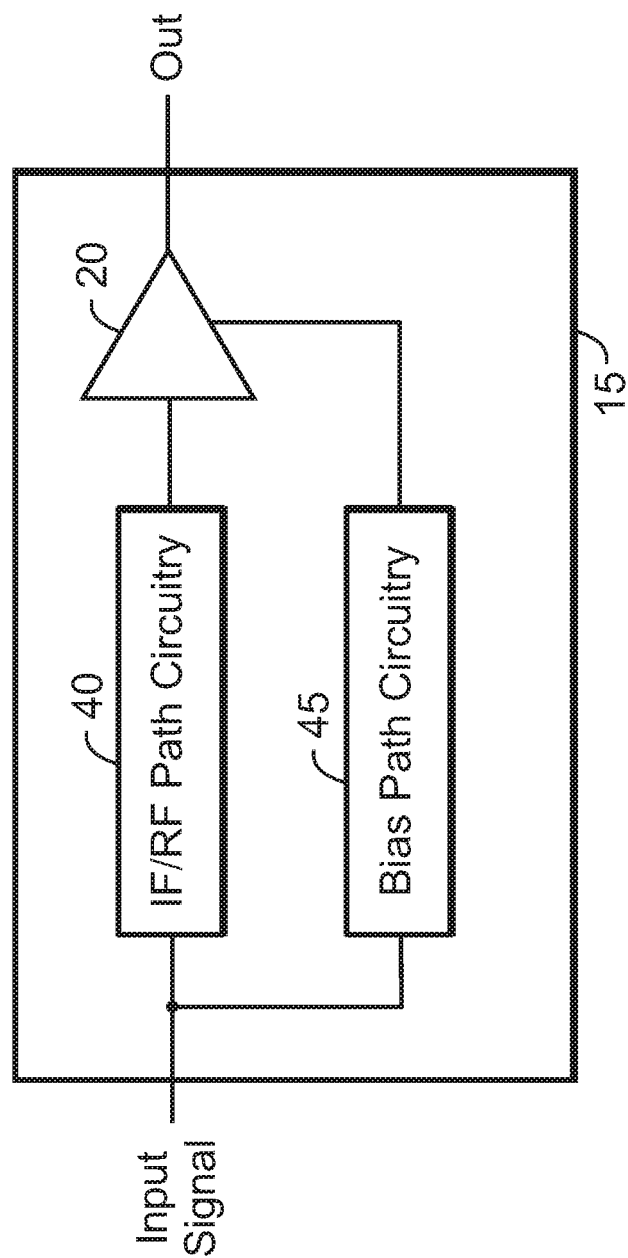
FIG. 3 shows an RF circuit including a PA with improved performance according to an exemplary embodiment.

FIG. 3 shows an RF circuitry 15 including a PA 20 with improved performance according to an exemplary embodiment. The RF circuitry 15 includes intermediate frequency (IF)/RF path circuitry 40, and bias path circuitry 45. In exemplary embodiments, if included, the IF circuitry performs IF functionality, such as conversion, tuning, filtering, and the like, as persons of ordinary skill in the art will understand.

The IF/RF path circuitry 40 includes IF circuitry, RF circuitry, or both. In some embodiments, part of the TX circuitry (not shown) may be included in IF/RF path circuitry 40. Generally, the IF/RF path circuitry 40 processes a baseband or RF signal received as an input, and generates an RF signal suitable for amplification by the PA 20 and ultimately transmission (from the output of the PA 20, labeled "Out"), as described above.

The bias path circuitry 45 also receives the input signal of the IF/RF path circuitry 40. The bias path circuitry 45 modifies one or more bias currents (or voltage, or both, as noted above) for the PA 20. The bias path circuitry 45 provides the modified bias current(s) to the PA 20. The PA 20 uses the modified bias current(s) as part of the operation of the circuitry in the PA 20 to amplify the RF output signal of the IF/RF path circuitry 40.

Note that, although for the sake of brevity and clarity of presentation, the figures and the corresponding description refer to RF circuits 15, the circuits 15 may constitute other types of circuits in which PAs according to various embodiments may be used, as discussed above, and as persons of ordinary skill in the art will understand. For example, in the scenario where the PA 20 is an audio amplifier, the circuits 15 might constitute an audio circuit, and may include pre-amplifiers, filters, equalizers, etc., as persons of ordinary skill in the art will understand.

Figure 4:
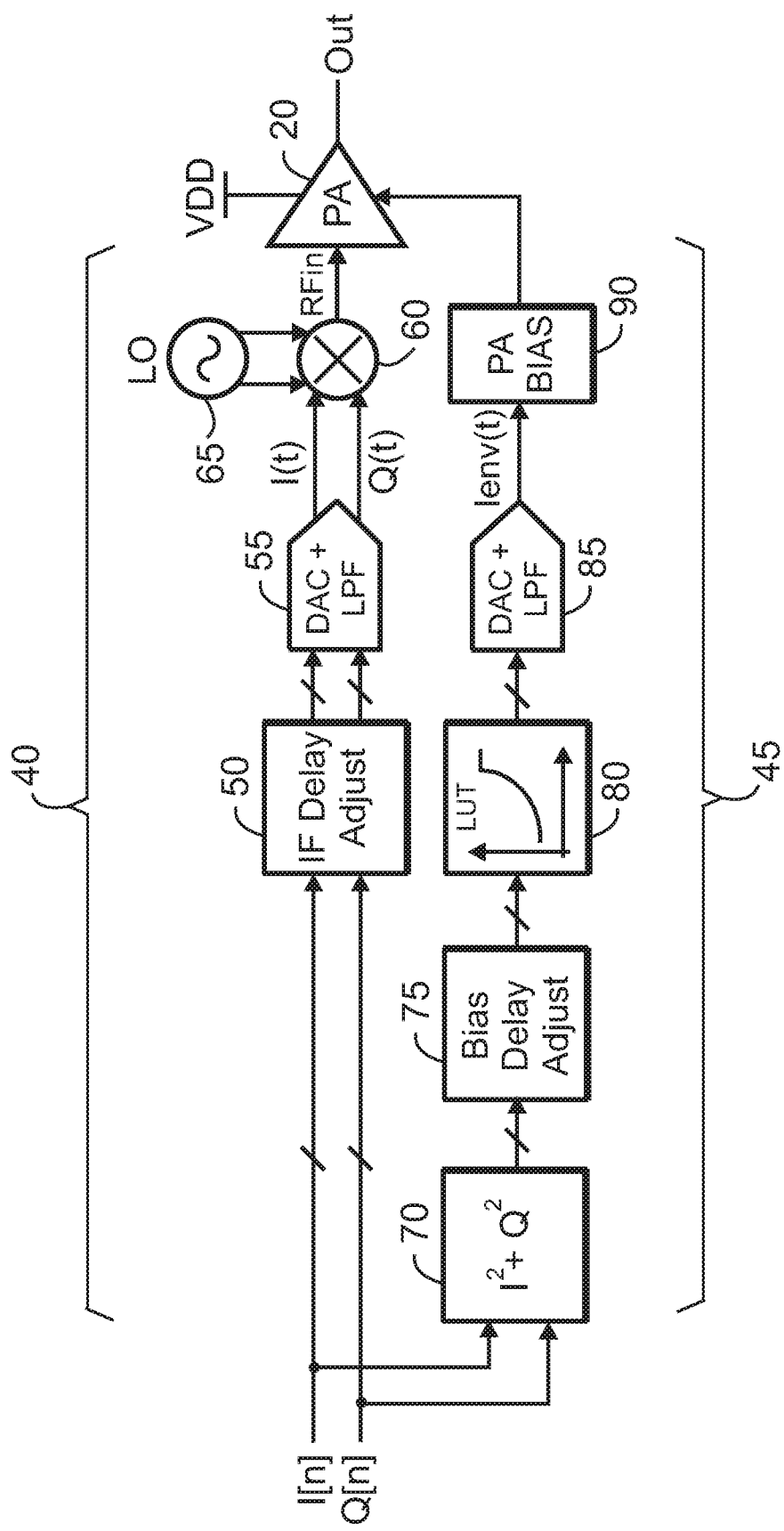
FIG. 4 shows a circuit arrangement for improving PA performance according to an exemplary embodiment.

FIG. 4 shows a circuit arrangement for improving PA performance according to an exemplary embodiment. More specifically, the figure shows details of the IF/RF path circuitry 40 and the bias path circuitry 45 according to an exemplary embodiment.

In the embodiment shown, complex digital signals are used, i.e., in-phase signal I[n] and quadrature signal Q[n], or more simply, I and Q. As persons of ordinary skill in the art will understand, however, real signals may be used, as desired, by making appropriate modifications.

The input signal (i.e., the I and Q signals) feeds an IF delay adjust circuit 50. The IF delay adjust circuit 50 compensates for the difference in the delays in the bias and modulation path circuits, i.e., the IF/RF path circuitry 40 and the bias path circuitry 45.

The output of the IF delay adjust circuit 50 drives an input of a circuit that includes a digital-to-analog converter (DAC) and a low-pass filter (LPF), i.e., the DAC and LPF circuit 55. The DAC converts the digital input signal received from the IF delay adjust circuit 50 to generate an analog signal. The LPF filters the analog signal to provide a filtered time-domain complex signal, labeled as I(t) and Q(t).

The filtered time-domain complex signal drives one input of mixer 60. An output of a local oscillator (LO) 65 drives another input of the mixer 60. The mixer 60 mixes the two inputs signal, and generates an RF signal labeled "RFin." The RF signal RFin drives the input of the PA 20. As noted above, the PA 20 amplifies the RFin signal to generate an RF signal labeled Out.

Turning to the bias path circuitry 45, a power calculation circuit 70 receives the I[n] and Q[n] signals, and calculates the power or square of the power of the input signal. The power calculation circuit 70 may calculate the square of the power by calculating the square of the I and Q signals, i.e., the quantity $I^2+Q^2$, which it provides to the bias delay adjust circuit 75. As an alternative, in some embodiments, the power calculation circuit 70 may calculate the power of the input signal by calculating the square-root of the sum of the squares of the I and Q signals, i.e., the quantity $(I^2+Q^2)^{0.5}$.

The bias delay adjust circuit 75 is optional, if the IF delay adjust circuit 50 is used. If used, the bias delay adjust circuit 75 can generate a range of delays (including negative delays) to compensate for changes in operating conditions or parameters of the circuitry in FIG. 4. Examples of the operating conditions or parameters include temperature, voltage, etc., as persons of ordinary skill in the art will understand.

The output of the bias delay adjust circuit 75 drives an input of look-up table (LUT) 80. The LUT 80 is used to generate an output value as a function of its input. Thus, the LUT 80 has a transfer function that generates a value that is a function of the input signal, i.e., ultimately the power of the input signals I[n] and Q[n] in the embodiment shown. In some embodiments, the LUT 80 is used to keep the gain of the PA 20 constant, so that efficiency and linearity can be improved. In other embodiments, the LUT 80 is used with different criteria or goals than constant gain, such as maximizing efficiency, in which case the gain of the PA 20 will not necessarily be constant. In such situations, to compensate for residual non-linearities, a block or circuit, such as a digital pre-distortion (DPD) circuit, may be used. More specifically, the DPD circuit generates the input signals, e.g., the I[n] and Q[n] signals, described above, and compensates for residual non-linearities. The output of the DPD circuit drives the inputs of the IF delay adjust circuit 50 and the power calculation circuit 70.

The output of LUT 80 drives DAC and LPF circuit 85. The DAC converts the digital input signal received from the LUT 80 to generate an analog signal. The LPF filters the analog signal to provide a filtered time-domain signal, labeled as "lenv(t)."

The filtered time-domain signal is provided to PA bias circuit 90. The PA bias circuit 90 generates one or more bias signals for the PA 20, such as a bias current, constant bias signals, etc. The filtered time-domain signal is used to modify at least one bias signal provided to the PA 20, such as a bias current.

Figure 5:
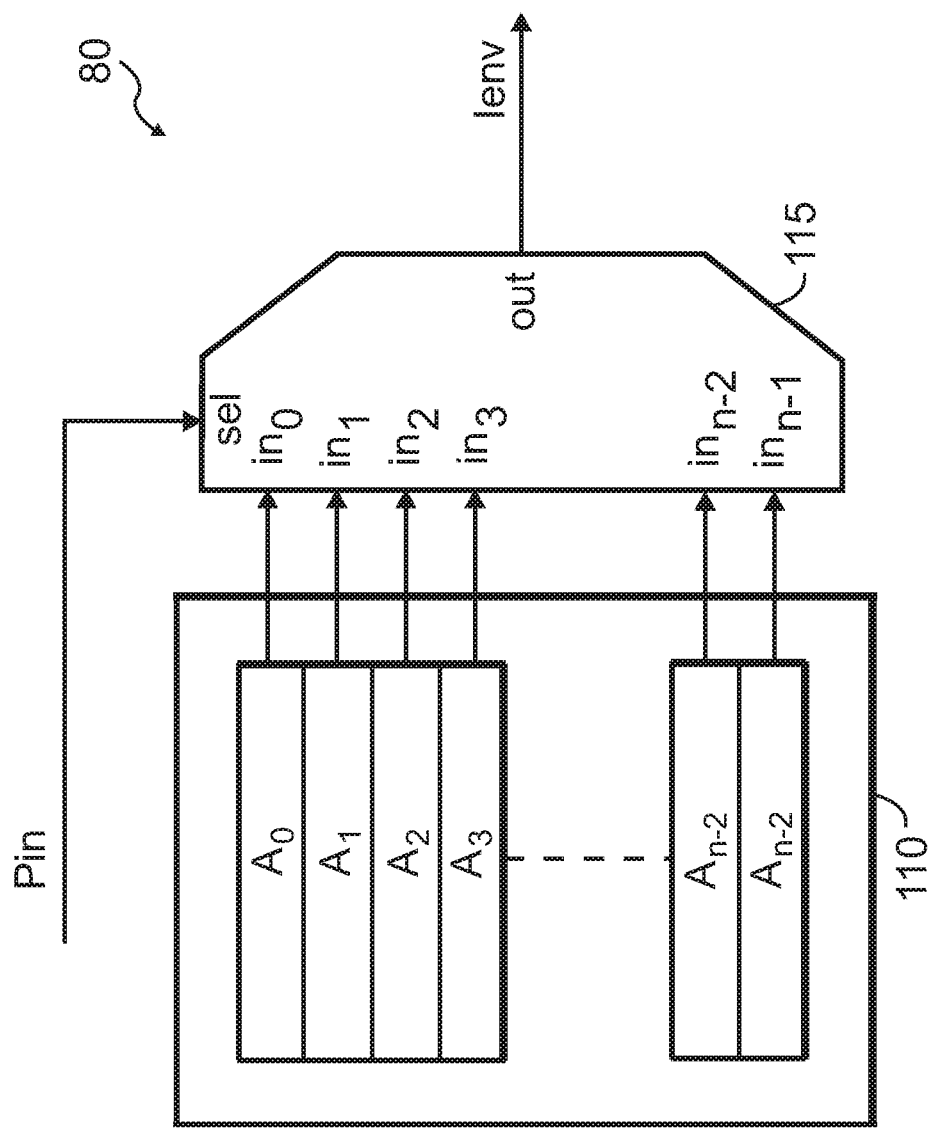
FIG. 5 shows a circuit arrangement for a look-up table (LUT) according to an exemplary embodiment.

FIG. 5 shows a circuit arrangement for the LUT 80 according to an exemplary embodiment. The LUT 80 includes a memory (or register or storage circuit) 110, and a multiplexer (MUX) 115. In the embodiment shown, the LUT 80 receives a measure of the input power to the PA or RFPA, i.e., Pin, and generates the "lenv" signal as an output signal.

The memory 110 has a number of locations, n, i.e., the same number as the bits in the input I and Q signals. The locations are denoted $A_0$ through $A_{n-1}$ in the figure. Each of the locations stores a value or number or function that maps various values of the Pin signal to a value of the lenv signal at the output of the MUX 115. Thus, the locations store pre-calculated values for a function that maps Pin values to respective lenv values.

More specifically, the output of each of the locations in the memory 110 drives a respective input of the MUX 115. The signal Pin is used as a select signal for the MUX 115. In response to the values of the Pin signal, one of the values provided to the inputs of the MUX 115 is provided at the output of the MUX 115 as the lenv signal.

Figure 6:
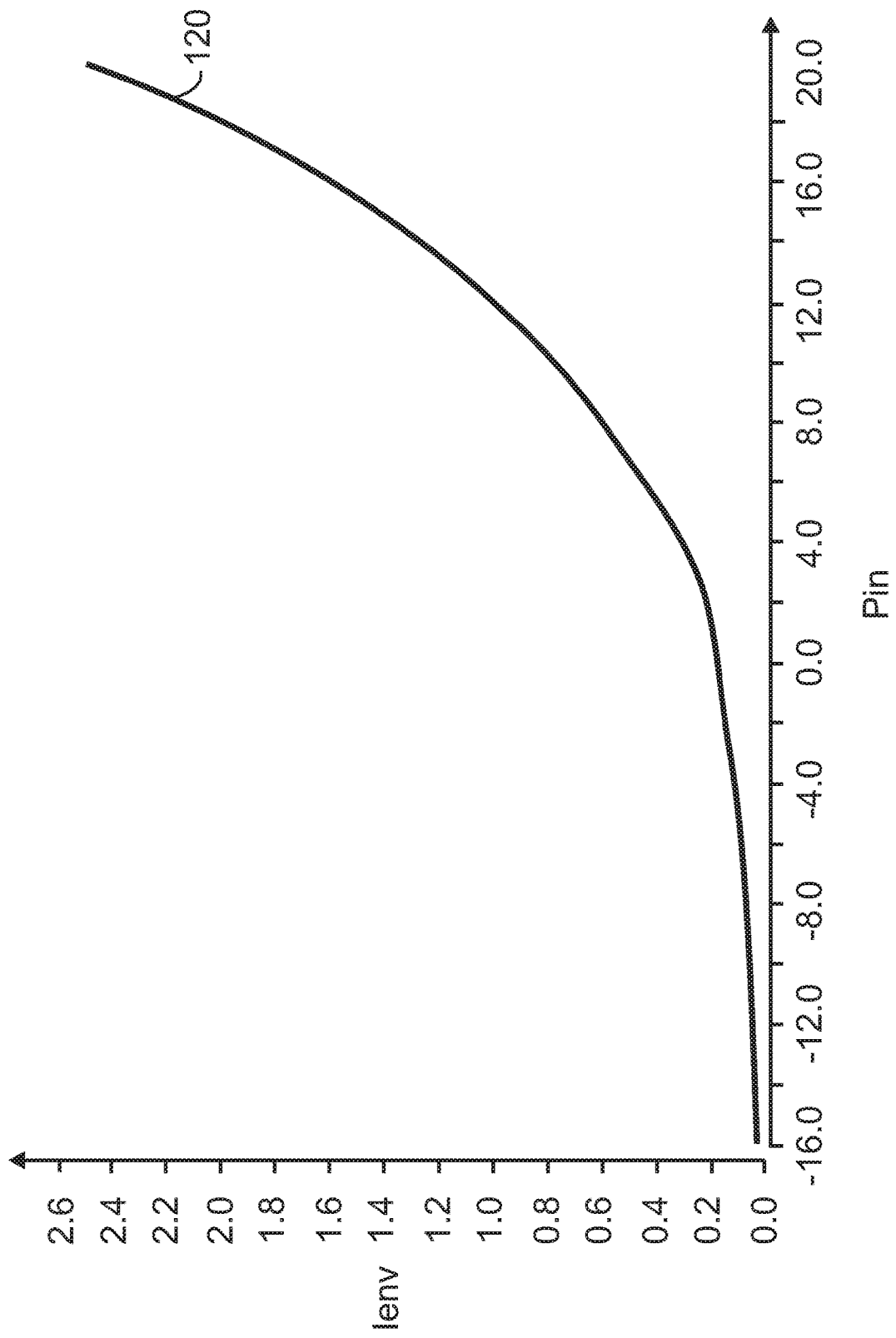
FIG. 6 shows a plot of a transfer function of a LUT according to an exemplary embodiment.

FIG. 6 shows a plot of a transfer function of a LUT 80 according to an exemplary embodiment. As shown in the figure, a curve 120 relates values of the Pin signal to specific values of the lenv signal. Note that the Pin values are shown in logarithmic notation, and thus in the example shown range from −16 to +20.

Note that the plot shown in FIG. 6 represents merely one example of a transfer function for the LUT 80. The choice of the transfer function and/or circuitry for a given LUT implementation depends on a variety of factors, as persons of ordinary skill in the art will understand. Such factors include design specifications, performance specifications, PA architecture, design, or topology, cost, IC or device area, available technology, such as semiconductor fabrication technology, target markets, target end-users, etc.

Figure 7:
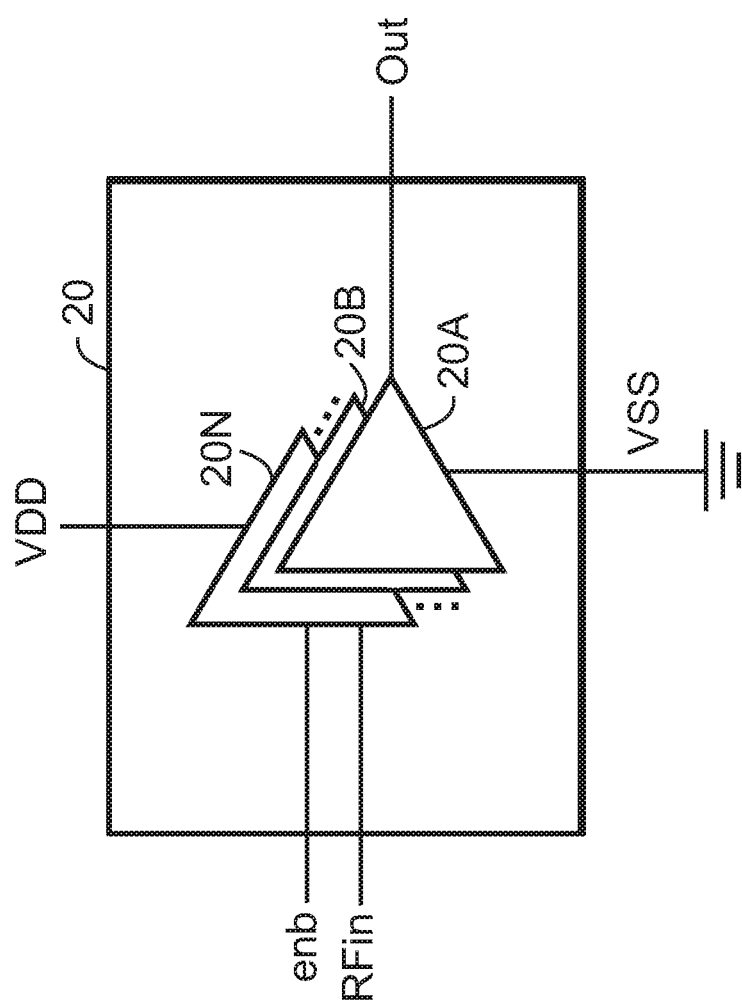
FIG. 7 shows a circuit arrangement for a PA with multiple slices according to an exemplary embodiment.

FIG. 7 shows a circuit arrangement for a PA 20 with multiple "slices" according to an exemplary embodiment. The PA 20 uses multiple amplifier circuits, or slices, coupled in parallel. The use of multiple slices allows achieving an overall desired power level at the output of the PA 20 while using slices or power amplifier circuits that individually can provide less output power than the overall PA or RFPA.

Furthermore, the use of slices allows setting (or configuring or trimming or programming) the overall gain of the PA 20. More specifically, by turning on certain slices and turning off certain other slices, fewer than all of the slices may be used, with a corresponding power level at the output of the PA 20. Note that the PA 20 shown in the figure includes an enable (labeled "enb") input that may be optionally used in some embodiments. In such embodiments, an enable signal may be used to turn off (disable) or turn on (enable) individual or groups of slices in the PA 20, as described below. Note further that in some embodiments, other schemes may be used to turn on or turn off slices in the PA 20, as persons of ordinary skill in the art will understand. For example, the bias signals (voltage(s), current(s)) may be used to turn on or turn off desired slices in the PA 20.

In the embodiment shown, the PA 20 includes slices 20A-20N. The slices 20A-20N receive power via the VDD power supply line. Furthermore, the slices 20A-20N are coupled to the VSS ground line. The slices 20A-20N receives the input signal of the PA 20, i.e., the signal RFin. The slices 20A-20N is coupled to, and drives, the output of the PA 20, i.e., the signal at the output Out. Each of the slices 20A-20N also receives one or more bias signals, such as bias currents, from the PA bias circuitry (not shown).

Figure 8:
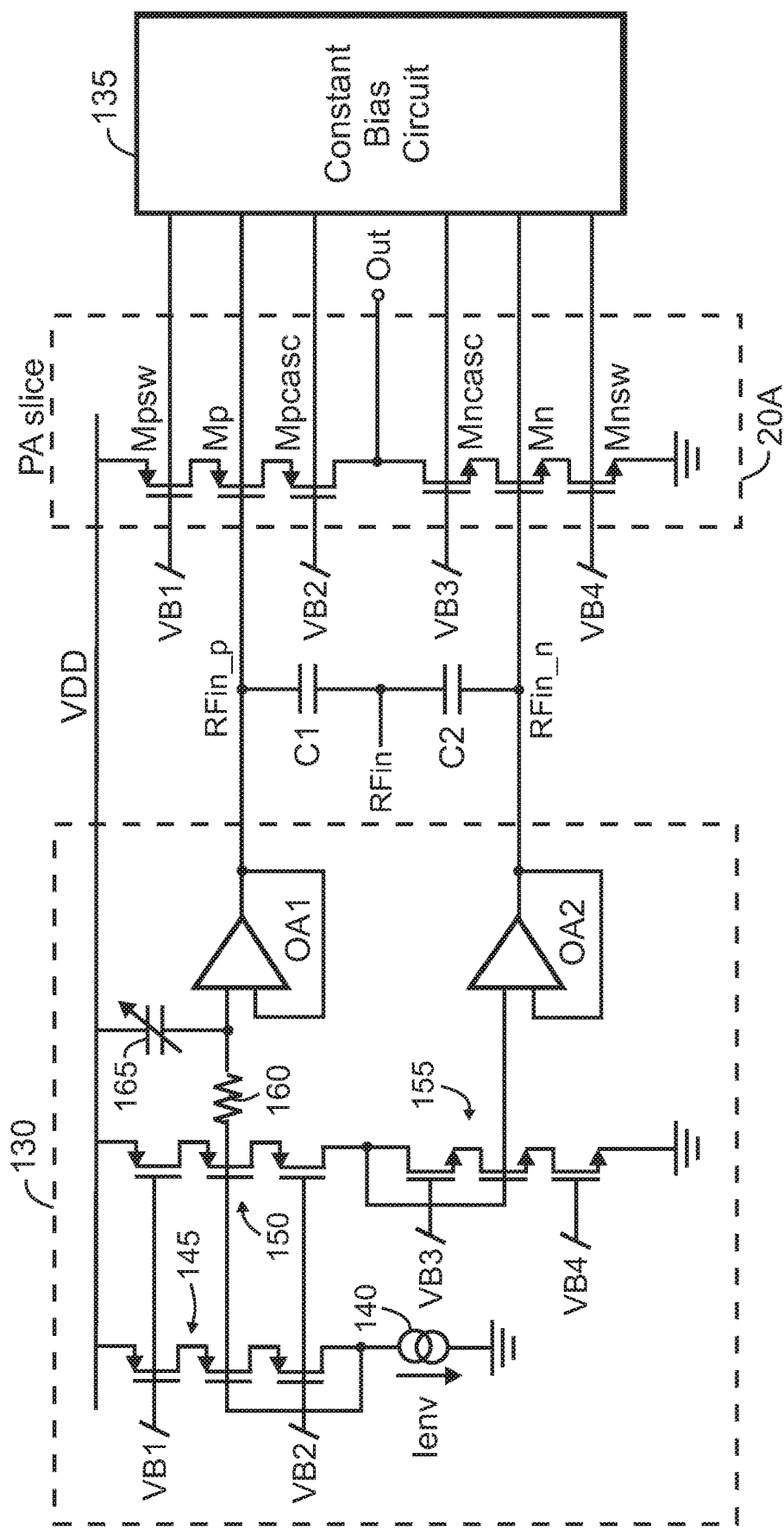
FIG. 8 shows a circuit arrangement for biasing a PA according to an exemplary embodiment.

FIG. 8 shows a circuit arrangement for biasing a PA 20 according to an exemplary embodiment. The circuit arrangement includes dynamic bias circuit 130 and constant bias circuit 135. Together, the dynamic bias circuit 130 and the constant bias circuit 135 form the PA bias circuit 90 (see FIG. 4).

Referring again to FIG. 8, a single PA slice, slice 20A is shown. The dynamic bias circuit 130 and the constant bias circuit 135 provide bias signals to other PA slices, as desired (e.g., as many slices as desired for a specified output power from the PA 20). Note that the circuit topology and configuration of the PA 20 shown in the figure is merely one example, and not limiting of the scope of the disclosure. As persons of ordinary skill in the art will understand, other PA designs and topologies may be used, as desired. For example, in some embodiments, the PA includes n-type metal oxide semiconductor field effect transistors (MOSFETs), but not p-type MOSFETs. As another example, in some embodiments, the PA includes p-type MOSFETs, but not n-type MOSFETs.

In the embodiment shown, the PA slice 20A includes a stack of p-type MOSFETs coupled to a stack of n-type MOSFETs. The node between the two stacks provides the PA output signal, Out. The p-type stack includes transistors Mpsw, Mp, and Mpcasc (cascode transistor) coupled in series. Similarly, the n-type stack includes transistors Mnsw, Mn, and Mncasc (cascode transistor) coupled in series.

In the embodiment shown, the gates of transistors Mp and Mn are driven by signals RFin_p and RFin_n, as described below. The constant bias circuit 135 generates four bias voltages, termed VB1 through VB4, respectively. The four bias voltages are used to drive the gates of transistors Mpsw, Mpcasc, Mncasc, and Mnsw, respectively. By disabling or changing the bias voltages VB1 and VB4, the transistors Mpsw and Mnsw may be turned on or turned off, depending on whether the PA slice 20A should be turned on or turned off, respectively. As an alternative, in some embodiments, additional transistors may be used to turn on or turn off the transistors Mpsw and Mnsw depending on a binary logic value of an enable signal. This alternative configuration is described below in detail in connection with FIG. 11.

Referring again to FIG. 8, the dynamic bias circuit 130 includes a current source 140, a stack of MOSFETS 145, a stack of MOSFETs 150, a stack of MOSFETs 155, and buffers OA1 and OA2. The current source 140 conducts a current proportional (or same) as the signal lenv, described above. The current flows through the stack of MOSFETs 145. The gates of the top and bottom MOSFETs in the stacks of MOSFETs 145 and 150 are biased by the bias voltages VB1 and VB2, respectively. The gates of the middle MOSFETS in the stacks of MOSFETs 145 and 150 are biased by the voltage across the current source 140.

The stack of MOSFETs 150 and 155 are coupled in a tandem or series configuration. The gates of the top and bottom MOSFETs in the stack of MOSFETs 155 is biased by the bias voltages VB3 and VB4, respectively. The gate of the middle MOSFET in the stack of MOSFETs 155 is biased by the voltage at the node between the stack of MOSFETs 150 and 155. The buffer OA2 buffers the voltage at the node between the stack of MOSFETs 150 and 155. The output of the buffer OA2 provides the RFin_n signal, which is coupled to the RFin (input signal of the PA 20) via capacitor C2.

The input of the buffer OA1 receives the voltage across the current source 140 via resistor 160. The output of the buffer OA1 drives the gate of transistor Mp, and is also coupled to the RFin signal via capacitor C1. Capacitor 165 couples the input of the buffer OA1 to the supply voltage VDD. Together, the resistor 160 and the capacitor 165 form a low-pass filter that allows aligning in time (by adjusting the capacitance value of the capacitor 165) of the RFin_p and the RFin_n signals, which drive, respectively, the gates of the Mp and Mn transistors in the PA slice 20A.

Figure 9:
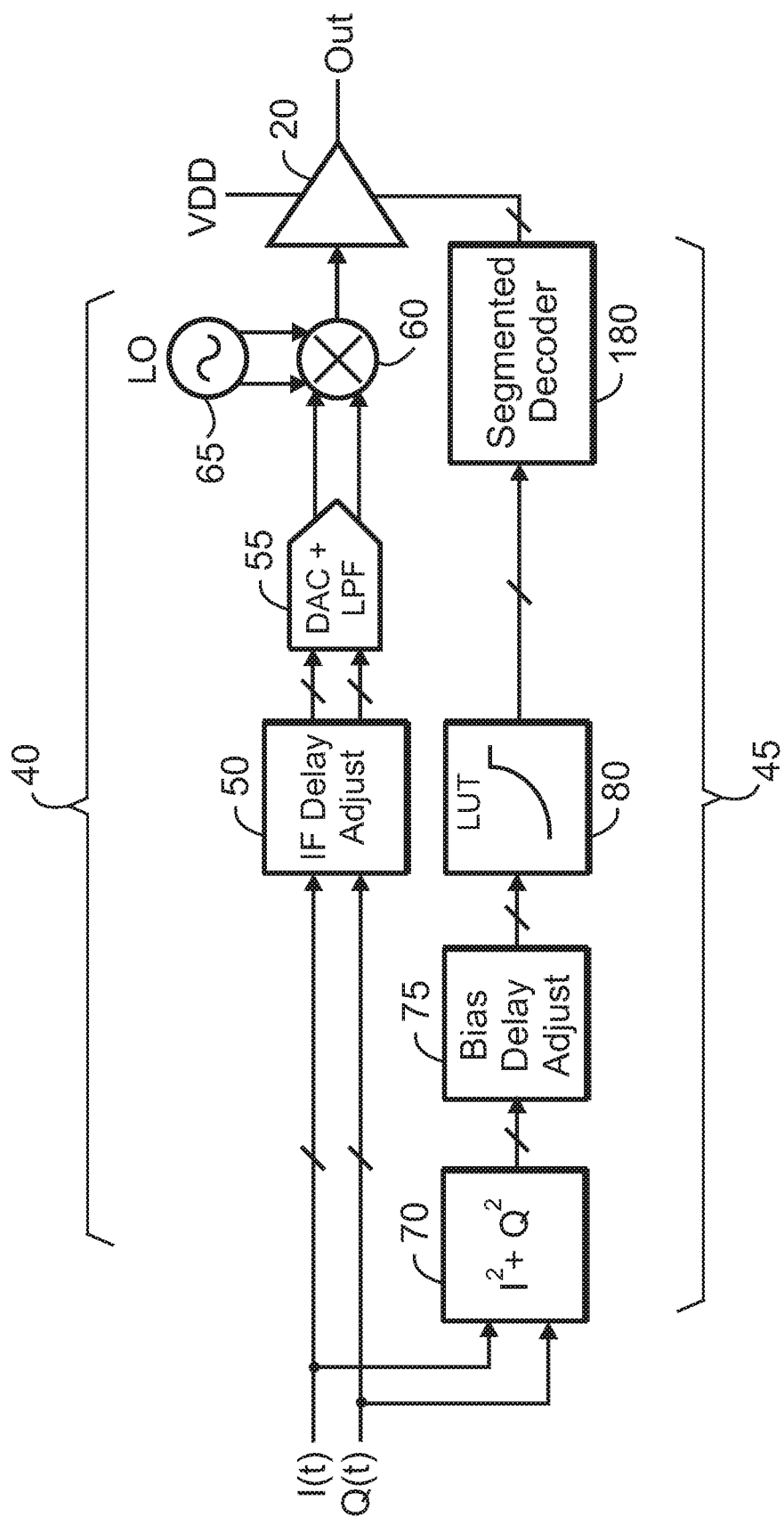
FIG. 9 shows a circuit arrangement for improving PA performance according to an exemplary embodiment.

FIG. 9 shows a circuit arrangement for improving PA performance according to an exemplary embodiment. More specifically, circuit arrangement shows efficiency improvement and linearization implemented in the digital domain. The IF/RF path circuitry 40 includes the same blocks as does its analog-domain counterpart (see FIG. 4). Similarly, the bias path circuitry 45 in FIG. 9 includes some of the same components as does its analog-domain counterpart, including the power calculation circuit 70, the bias delay adjust circuit 75, and the LUT 80.

Instead of the DAC and LPF circuit 85 and the PA bias circuit 90, however, the bias path circuitry 45 in FIG. 9 includes a segmented decoder 180. Consequently, the digital-domain implementation of PA efficiency improvement and linearization saves hardware, reduces cost, power consumption, chip area, etc., as persons of ordinary skill in the art will understand. In some embodiments, the LUT 80 is used to keep the gain of the PA 20 constant, so that efficiency and linearity can be improved. In other embodiments, the LUT 80 is used with different criteria or goals than constant gain, such as maximizing efficiency, in which case the gain of the PA 20 will not necessarily be constant. In such situations, to compensate for residual non-linearities, a block or circuit, such as a DPD circuit, described above, may be used. More specifically, the DPD circuit generates—the input signals, e.g., the I[n] and Q[n] signals, described above, and compensates for residual non-linearities. The output of the DPD circuit drives the inputs of the IF delay adjust circuit 50 and the power calculation circuit 70.

The segmented decoder 180 translates a set of bits received from the LUT 80 into a larger set of output signal levels that are used to drive the slices in the PA 20. For example, in an exemplary embodiment where the LUT 80 provides 8 bits of output, the segmented decoder 180 can translate those 8 bits into 256 levels, which may be used to drive 256 PA slices. In this example, the segmented decoder 180 keeps the 3 least significant bits (LSBs) in binary format, but decodes the remaining 5 bits into 31 lines used to drive the PA slices.

Figure 10:
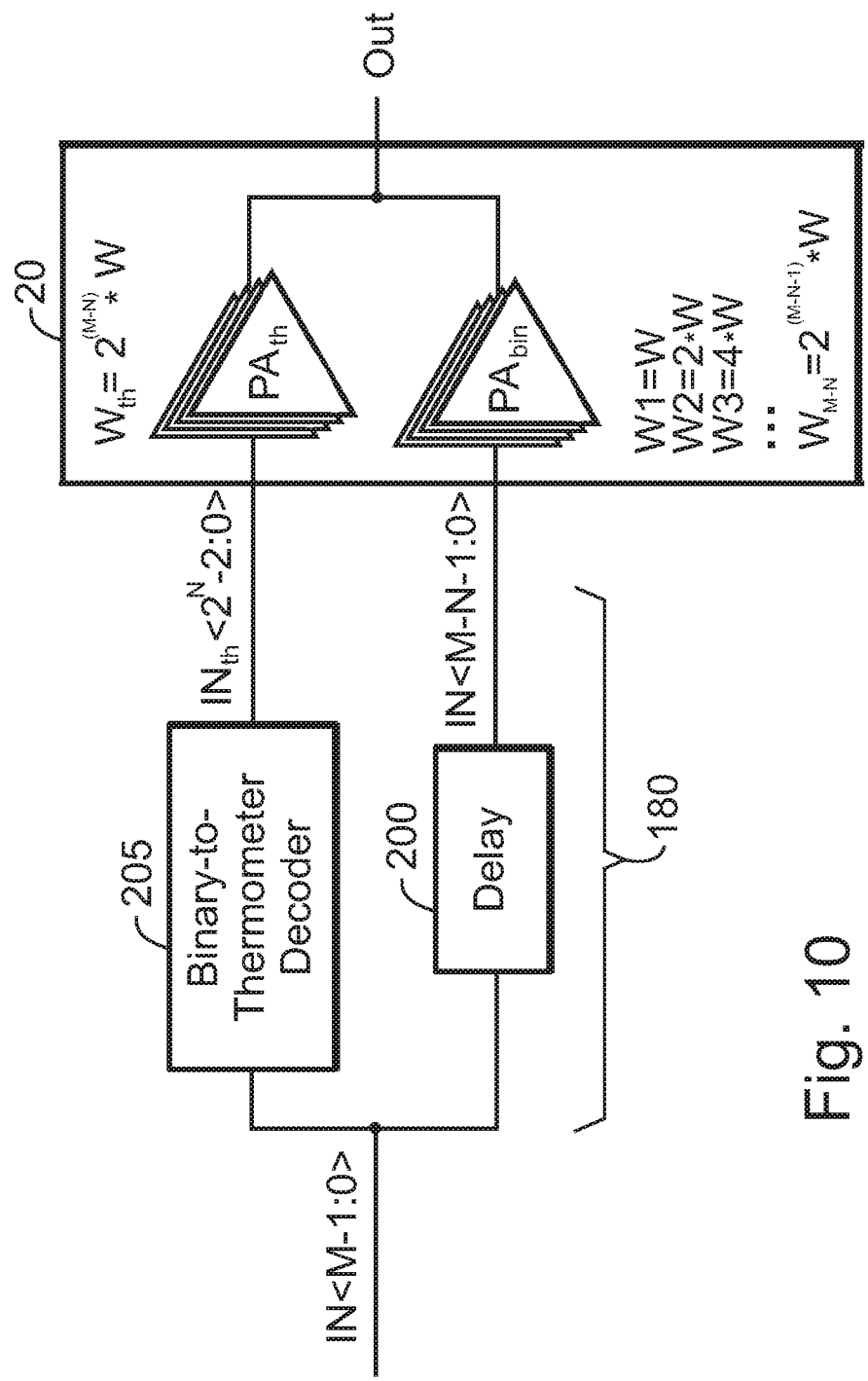
FIG. 10 shows a circuit arrangement for a segmented decoder according to an exemplary embodiment.

FIG. 10 shows a circuit arrangement for the segmented decoder 180, used to drive the PA 20, according to an exemplary embodiment. The segmented decoder 180 includes delay circuit 200 and binary-to-thermometer decoder 205. The outputs of the delay circuit 200 and the binary-to-thermometer decoder 205 are used together to drive or provide dynamic bias to the PA 20. In the figure, the PA 20 is shown as having one set of slices $PA_{th}$ driven by the binary-to-thermometer decoder 205, and another set of slices $PA_{bin}$ driven by the delay circuit 200. The delay circuit 200 compensates for the delay through the binary-to-thermometer decoder 205.

The segmented decoder 180 takes M binary bits as its input, and generates two sets of output signals: a $(2^N-1)$-bit thermometer-decoded output (from the binary-to-thermometer decoder 205), and an (M-N)-bit binary output (from the delay circuit 200, and also delay compensated). In this manner, the signal routing can be reduced or minimized compared to a full binary-to-thermometer decoder. For example, a 7-bit (i.e., M equals 7) binary input decoded by a thermometer decoder would generate 128 output lines to be routed. In contrast, a 4-3-segmented decoder (i.e., (N equals 4, and M-N equals 3)) generates $2^4-1+3$, or 18, output lines. Assuming that a base PA slice has a width W (e.g., the width of the Mp and Mn MOSFETs, for a given channel length), the PA slices $PA_{th}$ have a fixed width, as noted on the figure, of $W_{th}=2^{(M-N)}*W$, where "*" denotes a multiplication operation. Conversely, the PA slices $PA_{bin}$ have widths that vary in a binary fashion or weighting. Thus, the first slice has a width W1=W, the second slice has a width W1=2*W, and so on, as the figure shows.

Figure 11:
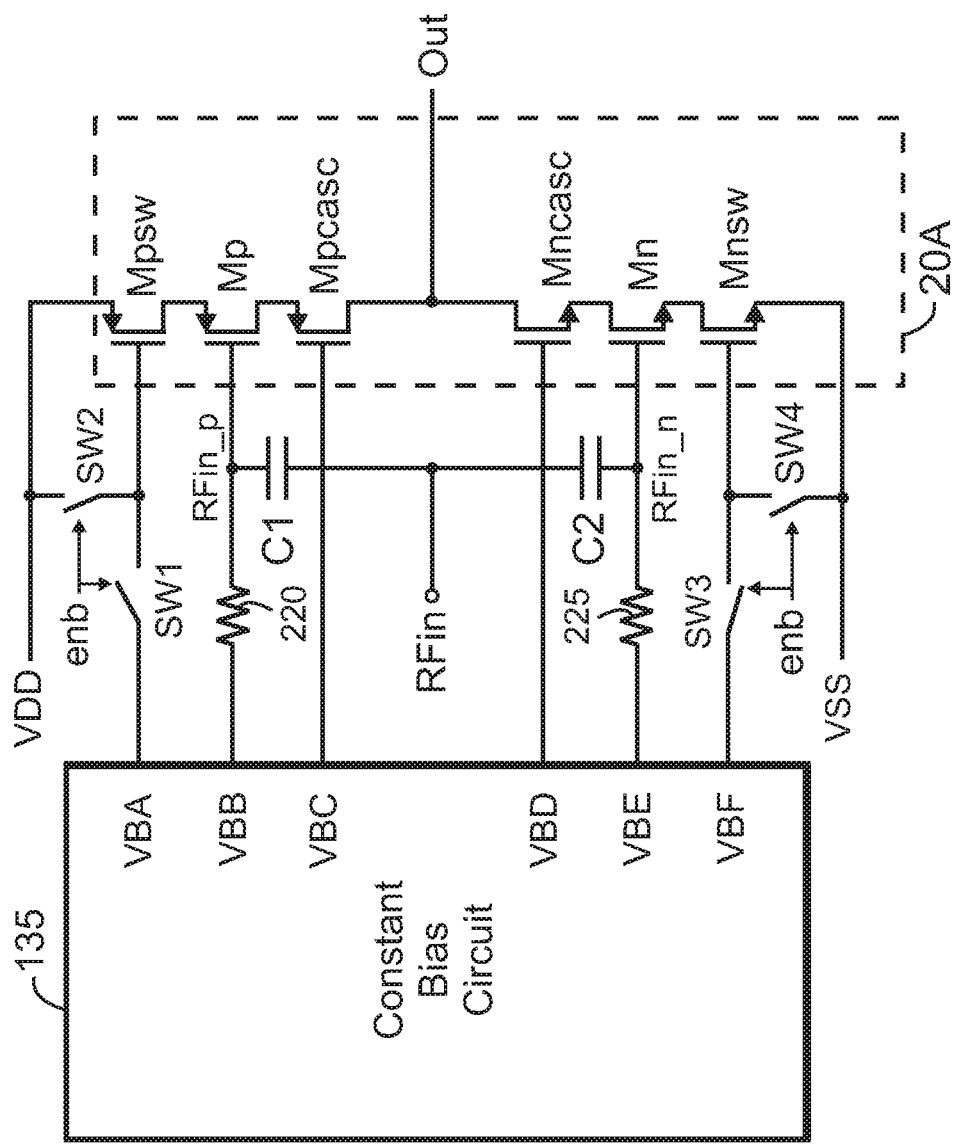
FIG. 11 shows a circuit arrangement for biasing a PA according to an exemplary embodiment.

FIG. 11 shows a circuit arrangement for biasing the PA 20 in the digital domain according to an exemplary embodiment. The circuit arrangement includes PA slice 20A. The PA slice 20A is similar to the PA slice 20A in FIG. 8. Note that the circuit topology and configuration of the PA 20 shown in the figures is merely one example, and not limiting of the scope of the disclosure. As persons of ordinary skill in the art will understand, other PA designs and topologies may be used, as desired. For example, in some embodiments, the PA includes n-type MOSFETs, but not p-type MOSFETs. As another example, in some embodiments, the PA includes p-type MOSFETs, but not n-type MOSFETs.

In the embodiment shown, the PA slice 20A includes a stack of p-type MOSFETs coupled to a stack of n-type MOSFETs. The node between the two stacks provides the PA output signal, Out. The p-type stack includes transistors Mpsw, Mp, and Mpcasc (cascode transistor) coupled in series. Similarly, the n-type stack includes transistors Mnsw, Mn, and Mncasc (cascode transistor) coupled in series.

In the embodiment shown, the gates of transistors Mp and Mn are driven by signals RFin_p and RFin_n, as described below. The constant bias circuit 135 generates multiple bias voltage, labeled VBA through VBF, respectively. The constant bias circuit 135 provides bias signals to other PA slices, as desired (e.g., as many slices as desired for a specified output power from the PA 20).

The bias voltages VBA, VBC, VBD, and VBF are used to drive the gates of transistors Mpsw, Mpcasc, Mncasc, and Mnsw, respectively. The bias voltages VBB and VEE drive the gates of MOSFETs Mp and Mn via resistors 220 and 225, respectively. The capacitor C1 couples the input RF voltage, RFin, to the gate of the MOSFET Mp (i.e., node RFin_p). Similarly, the capacitor C2 couples the input RF voltage, RFin, to the gate of the MOSFET Mn (i.e., node RFin_n). Thus, the RFin signal is capacitively coupled to the gates of the MOSFETs Mp and Mn.

Transistors Mpsw and Mnsw can be selectively turned on or turned off by an enable signal (labeled "enb") for the particular or respective slice of the PA 20. In other words, the enable signal for a given slice of the PA is used to turn on or off the MOSFETs Mpsw and Mnsw. In this manner, the bias provided to the PA slice 20A can be modified. Note that the bias current for a given slice is either zero (or nearly zero, in a practical implementation, where leakage currents are present) when slice is off, or it is set by the VBB and VBE voltages when the slice is on. Although the voltages VBA-VBF remain constant, the current flowing from VDD to VSS is not constant, and depends on the status (i.e., on or off) of the transistors Mnsw and Mpsw, as described above.

More specifically, when the enable signal has a binary zero (or logic low) level, switches SW1 and SW3 are closed. Consequently, the MOSFETs Mpsw and Mnsw are turned on, and the PA slice 20A provides output power. Conversely, when the enable signal has a binary one (or logic high) level, switches SW2 and SW4 are closed. As a result, the MOSFETs Mpsw and Mnsw are turned off, and the PA slice 20A does not provide output power.

Note that, as noted above, the same arrangement of switches SW1-SW4, coupled to the MOSFETs Mpsw and Mnsw, respectively, may be used in the analog-domain implementation (see FIG. 8). In that scenario, the enable signal is provided for each slice of the PA by another circuit (not shown in FIG. 8), such as a controller, as the segmented decoder is not used in the analog-domain implementation. By using the enable signal for the various slices, individual slices may be disabled or turned off in order to control the output power of the PA 20 (and to reduce power consumption by turning off or disabling unused PA slices).

Figure 12:
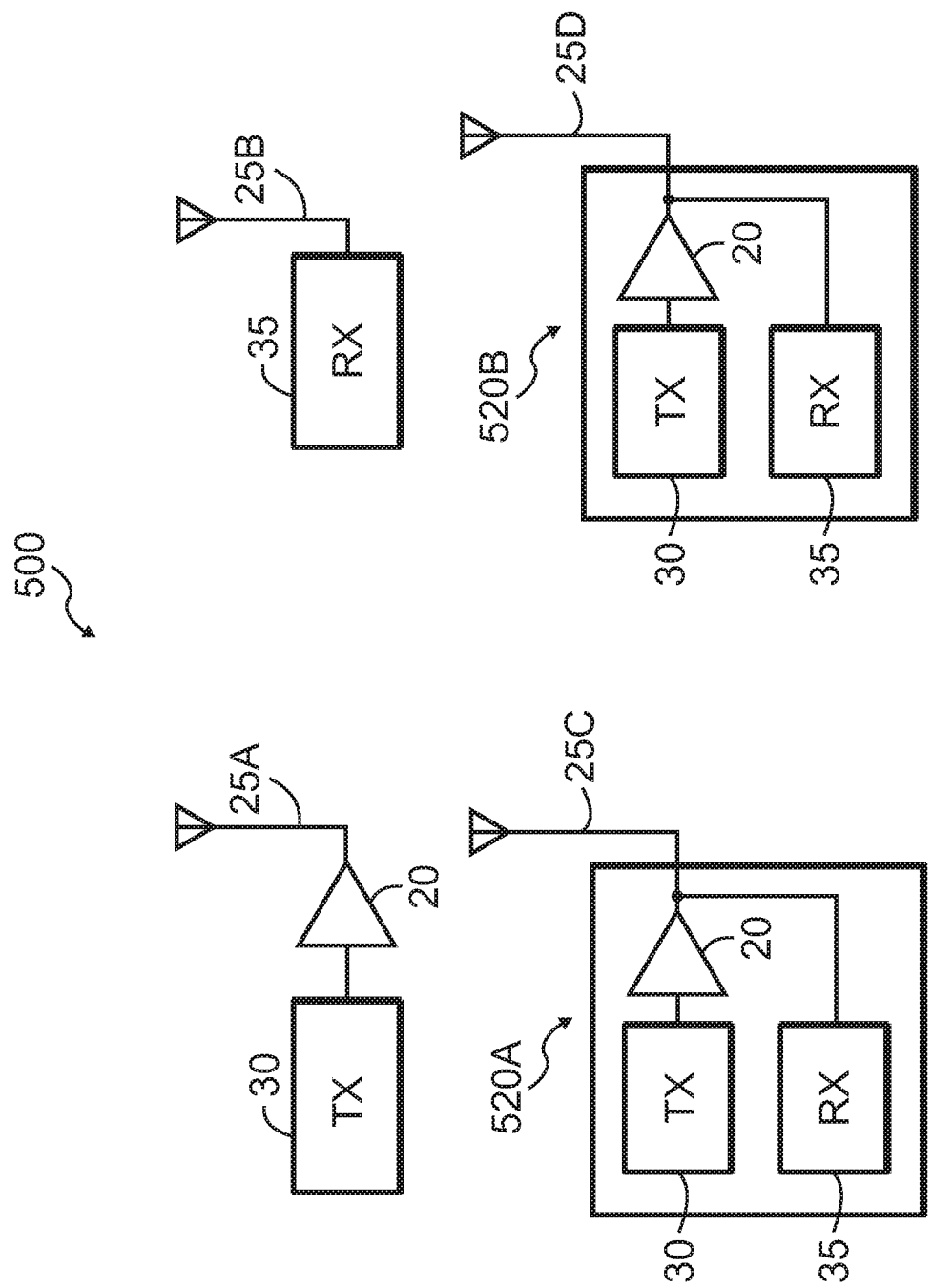
FIG. 12 shows a system for radio communication according to an exemplary embodiment.

PAs or RFPAs according to exemplary embodiments may be used in a variety of communication arrangements, systems, sub-systems, networks, etc., as desired. FIG. 12 shows a system 500 for radio communication according to an exemplary embodiment. The PAs 20 used in system 500 may be the same or based on the PAs described above. Thus, the PAs 20 in FIG. 12 provide the characteristics of the PAs described above, such as improved efficiency and linearity. In the system 500, the antennas represent the loads to the transmitters or the RFPAs.

System 500 includes a transmitter 30, coupled to the antenna 25A via the PA 20. Via antenna 503A, transmitter 515 transmits RF signals. The RF signals may be received by receiver 35, via the antenna 25B. In addition, or alternatively, transceiver 520A and/or transceiver 520B might receive (via receiver circuitry 35) the transmitted RF signals. In addition to receive capability, the transceiver 520A and the transceiver 520B can also transmit RF signals by using the TX circuitry 30 and the PAs 20.

Other systems or sub-systems with varying configuration and/or capabilities are also contemplated. For example, in some exemplary embodiments, two or more transceivers (e.g., transceiver 520A and transceiver 520B) might form a network, such as an ad-hoc network. As another example, in some exemplary embodiments, transceiver 520A and transceiver 520B might form part of a network, for example, in conjunction with the transmitter 30.

Figure 13:
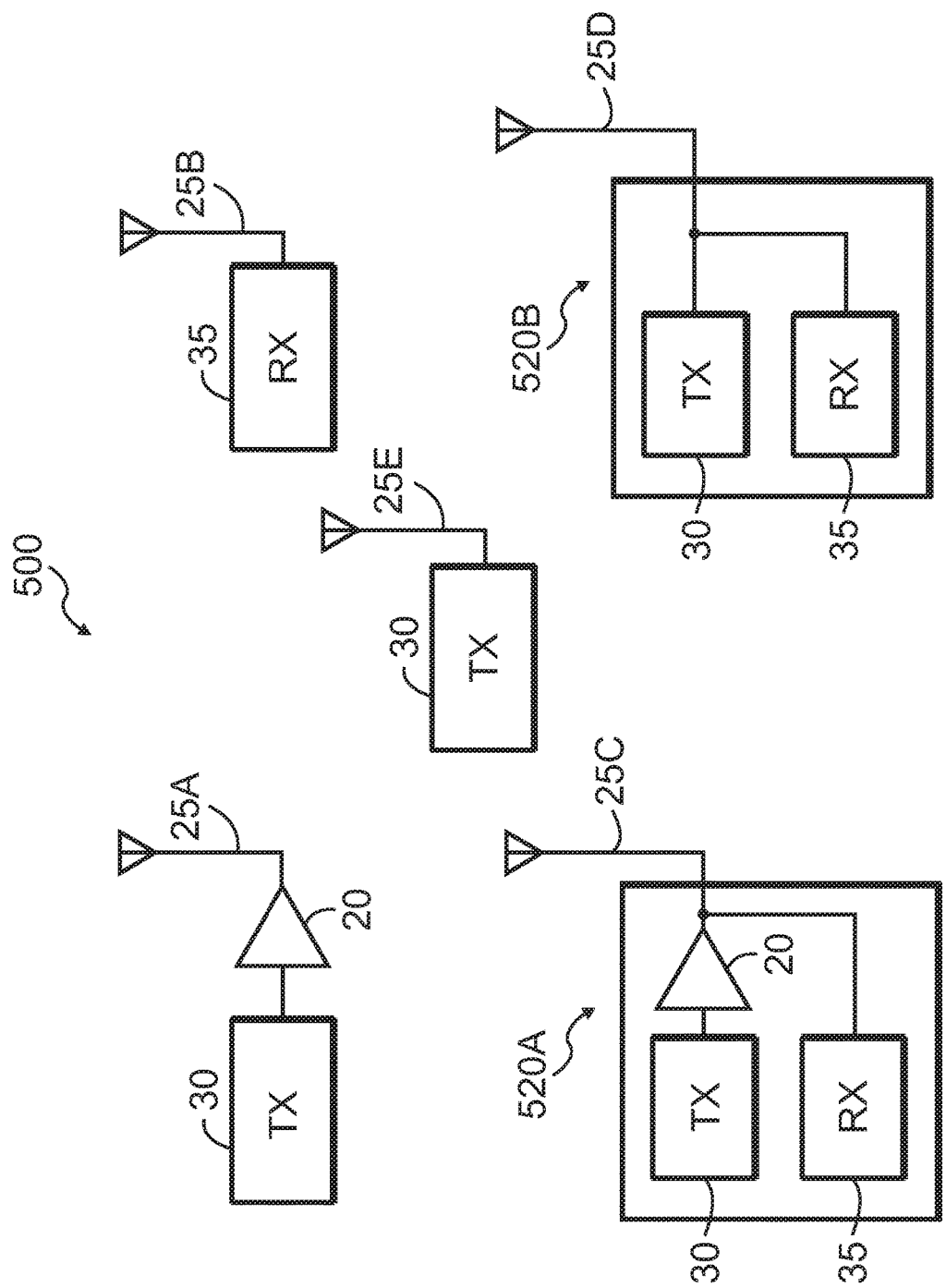
FIG. 13 shows a system for radio communication according to an exemplary embodiment.

As another example, FIG. 13 shows a system 500 for radio communication according to an exemplary embodiment. In this arrangement, the transceiver 520A uses a PA 20, as described above. The transceiver 520B does not use a PA 20, as described above, and instead might use a conventional PA. Similarly, one transmitter uses a PA 20 to transmit RF signals via the antenna 25A. Conversely, another transmitter transmits RF signals via the antenna 25E without using the PA 20 (e.g., it might use a conventional PA).

Figure 14:
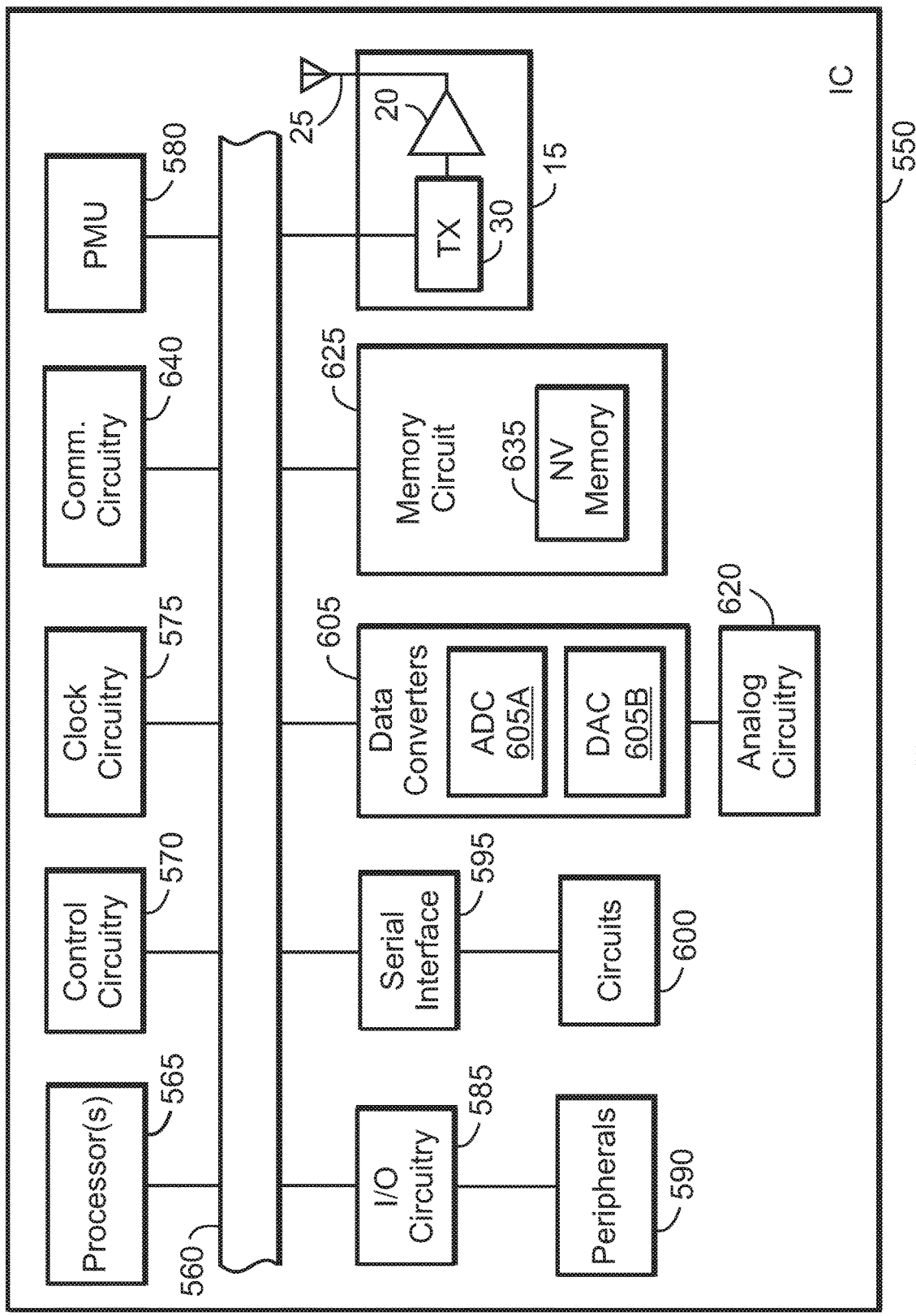
FIG. 14 shows a circuit arrangement for an IC, including a PA with improved performance, according to an exemplary embodiment.

The PAs 20, described above, may be used in a variety of circuits, blocks, subsystems, and/or systems. For example, in some embodiments, such PAs may be integrated in an IC, such as a microcontroller unit (MCU). FIG. 14 shows a block diagram of an IC 550 according to an exemplary embodiment. Similar to the system 500 (see FIGS. 12-13), the load 25 is represented by an antenna coupled to the PA 20.

The circuit arrangement includes an IC 550, which constitutes or includes an MCU. IC 550 includes a number of blocks (e.g., processor(s) 565, data converter 605, I/O circuitry 585, etc.) that communicate with one another using a link 560. In exemplary embodiments, link 560 may constitute a coupling mechanism, such as a bus, a set of conductors or semiconductor elements (e.g., traces, devices, etc.) for communicating information, such as data, commands, status information, and the like.

IC 550 may include link 560 coupled to one or more processors 565, clock circuitry 575, and power management circuitry or power management unit (PMU) 580. In some embodiments, processor(s) 565 may include circuitry or blocks for providing information processing (or data processing or computing) functions, such as central-processing units (CPUs), arithmetic-logic units (ALUs), and the like. In some embodiments, in addition, or as an alternative, processor(s) 565 may include one or more DSPs. The DSPs may provide a variety of signal processing functions, such as arithmetic functions, filtering, delay blocks, and the like, as desired.

IC 550 includes RF circuitry 15. In the embodiment shown, RF circuitry 15 is similar to the embodiment shown in FIG. 1. Thus, the RF circuitry 15 includes the TX circuitry 30 coupled to the PA 20, as described above.

Referring to FIG. 14, clock circuitry 575 may generate one or more clock signals that facilitate or control the timing of operations of one or more blocks in IC 550. Clock circuitry 575 may also control the timing of operations that use link 560, as desired. In some embodiments, clock circuitry 575 may provide one or more clock signals via link 560 to other blocks in IC 550.

In some embodiments, PMU 580 may reduce an apparatus's (e.g., IC 550) clock speed, turn off the clock, reduce power, turn off power, disable (or power down or place in a lower power consumption or sleep or inactive or idle state), enable (or power up or place in a higher power consumption or normal or active state) or any combination of the foregoing with respect to part of a circuit or all components of a circuit, such as one or more blocks in IC 550. Further, PMU 580 may turn on a clock, increase a clock rate, turn on power, increase power, or any combination of the foregoing in response to a transition from an inactive state to an active state (including, without limitation, when processor(s) 565 make a transition from a low-power or idle or sleep state to a normal operating state).

Link 560 may couple to one or more circuits 600 through serial interface 595. Through serial interface 595, one or more circuits or blocks coupled to link 560 may communicate with circuits 600. Circuits 600 may communicate using one or more serial protocols, e.g., SMBUS, $I^2C$, SPI, and the like, as person of ordinary skill in the art will understand.

Link 560 may couple to one or more peripherals 590 through I/O circuitry 585. Through I/O circuitry 585, one or more peripherals 590 may couple to link 560 and may therefore communicate with one or more blocks coupled to link 560, e.g., processor(s) 565, memory circuit 625, etc.

In exemplary embodiments, peripherals 590 may include a variety of circuitry, blocks, and the like. Examples include I/O devices (keypads, keyboards, speakers, display devices, storage devices, timers, sensors, etc.). Note that in some embodiments, some peripherals 590 may be external to IC 550. Examples include keypads, speakers, and the like.

In some embodiments, with respect to some peripherals, I/O circuitry 585 may be bypassed. In such embodiments, some peripherals 590 may couple to and communicate with link 560 without using I/O circuitry 585. In some embodiments, such peripherals may be external to IC 550, as described above.

Link 560 may couple to analog circuitry 620 via data converter(s) 605. Data converter(s) 605 may include one or more ADCs 605A and/or one or more DACs 605B.

ADC(s) 605A receive analog signal(s) from analog circuitry 620, and convert the analog signal(s) to a digital format, which they communicate to one or more blocks coupled to link 560. Conversely, DAC(s) 605B receive digital signal(s) from one or more blocks coupled to link 560, and convert the digital signal(s) to analog format, which they communicate to analog circuitry 620.

Analog circuitry 620 may include a wide variety of circuitry that provides and/or receives analog signals. Examples include sensors, transducers, and the like, as person of ordinary skill in the art will understand. In some embodiments, analog circuitry 620 may communicate with circuitry external to IC 550 to form more complex systems, sub-systems, control blocks or systems, feedback systems, and information processing blocks, as desired.

Control circuitry 570 couples to link 560. Thus, control circuitry 570 may communicate with and/or control the operation of various blocks coupled to link 560 by providing control information or signals. In some embodiments, control circuitry 570 also receives status information or signals from various blocks coupled to link 560. In addition, in some embodiments, control circuitry 570 facilitates (or controls or supervises) communication or cooperation between various blocks coupled to link 560.

In some embodiments, control circuitry 570 may initiate or respond to a reset operation or signal. The reset operation may cause a reset of one or more blocks coupled to link 560, of IC 550, etc., as person of ordinary skill in the art will understand. For example, control circuitry 570 may cause PMU 580, and circuitry such as various circuitry associated with the PA 20 (e.g., segmented decoder, DACs, controller, etc.), to reset to an initial or known state.

In exemplary embodiments, control circuitry 570 may include a variety of types and blocks of circuitry. In some embodiments, control circuitry 570 may include logic circuitry, finite-state machines (FSMs), or other circuitry to perform operations such as the operations described above.

Communication circuitry 640 couples to link 560 and also to circuitry or blocks (not shown) external to IC 550. Through communication circuitry 640, various blocks coupled to link 560 (or IC 550, generally) can communicate with the external circuitry or blocks (not shown) via one or more communication protocols. Examples of communications include USB, Ethernet, and the like. In exemplary embodiments, other communication protocols may be used, depending on factors such as design or performance specifications for a given application, as person of ordinary skill in the art will understand.

As noted, memory circuit 625 couples to link 560. Consequently, memory circuit 625 may communicate with one or more blocks coupled to link 560, such as processor(s) 565, control circuitry 570, I/O circuitry 585, etc.

Memory circuit 625 provides storage for various information or data in IC 550, such as operands, flags, data, instructions, and the like, as persons of ordinary skill in the art will understand. Memory circuit 625 may support various protocols, such as double data rate (DDR), DDR2, DDR3, DDR4, and the like, as desired.

In some embodiments, memory read and/or write operations by memory circuit 625 involve the use of one or more blocks in IC 550, such as processor(s) 565. A direct memory access (DMA) arrangement (not shown) allows increased performance of memory operations in some situations. More specifically, DMA (not shown) provides a mechanism for performing memory read and write operations directly between the source or destination of the data and memory circuit 625, rather than through blocks such as processor(s) 565.

Memory circuit 625 may include a variety of memory circuits or blocks. In the embodiment shown, memory circuit 625 includes non-volatile (NV) memory 635. In addition, or instead, memory circuit 625 may include volatile memory (not shown), such as random access memory (RAM). NV memory 635 may be used for storing information related to performance, control, or configuration of one or more blocks in IC 550. For example, NV memory 635 may store configuration information related to the PA 20, such as stored values for the LUT 80, the segmented decoder 180, the DAC, the delay circuit 200, the binary-to-thermometer decoder 205, etc.

Figure 15:
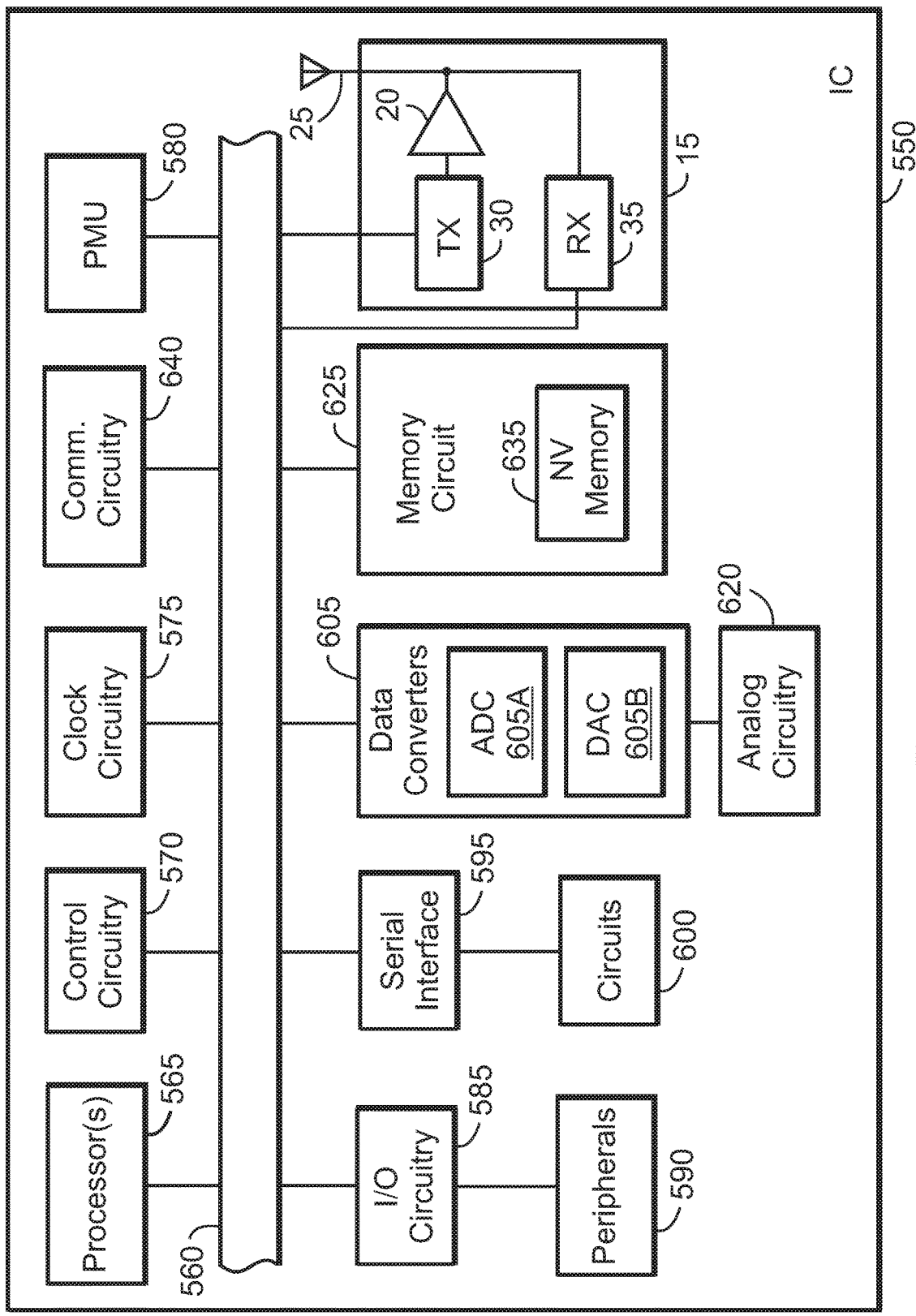
FIG. 15 shows a circuit arrangement for an IC, including a PA with improved performance, according to another exemplary embodiment.

FIG. 15 shows a block diagram of an IC 550 according to another exemplary embodiment. The IC 550 is similar to the IC 550 in FIG. 14. In the IC 550 in FIG. 15, however, the RF circuitry 15 constitutes RF transceiver circuitry, i.e., it includes the TX circuitry 30 coupled to the PA 20 to transmit via the antenna 25, and it also includes the RF circuitry 35 to receive RF signals via the antenna 25.

Various circuits and blocks described above and used in exemplary embodiments may be implemented in a variety of ways and using a variety of circuit elements or blocks. For example, the mixer 60 and the LO 65 may generally be implemented using analog circuitry. The analog circuitry may include bias circuits, decoupling circuits, coupling circuits, supply circuits, current mirrors, current and/or voltage sources, filters, amplifiers, converters, signal processing circuits (e.g., multipliers), sensors or detectors, transducers, discrete components (transistors, diodes, resistors, capacitors, inductors), analog MUXs, and the like, as desired, and as persons of ordinary skill in the art will understand. In addition, digital circuitry or mixed-signal circuitry or both may be included to implement, for example, the IF delay adjust circuit 50, the DAC and LPF circuit 55, the power calculation circuit 70, the bias delay adjust circuit 75, the LUT 80, the DAC and LPF circuit 85, the PA bias circuit 90, the dynamic bias circuit 130, the constant bias circuit 135, the segmented decoder 180, the delay circuit 200, and the binary-to-thermometer decoder 205. The digital circuitry may include circuit elements or blocks such as gates, digital multiplexers (MUXs), latches, flip-flops, registers, finite state machines (FSMs), processors, programmable logic (e.g., field programmable gate arrays (FPGAs) or other types of programmable logic), arithmetic-logic units (ALUs), standard cells, custom cells, custom analog cells, etc., as desired, and as persons of ordinary skill in the art will understand. The mixed-signal circuitry may include ADCs, DACs, etc., in addition to analog circuitry and digital circuitry, as described above, and as persons of ordinary skill in the art will understand. The choice of circuitry for a given implementation depends on a variety of factors, as persons of ordinary skill in the art will understand. Such factors include design specifications, performance specifications, cost, IC or device area, available technology, such as semiconductor fabrication technology), target markets, target end-users, etc.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to the embodiments in the disclosure will be apparent to persons of ordinary skill in the art. Accordingly, the disclosure teaches those skilled in the art the manner of carrying out the disclosed concepts according to exemplary embodiments, and is to be construed as illustrative only. Where applicable, the figures might or might not be drawn to scale, as persons of ordinary skill in the art will understand.

The particular forms and embodiments shown and described constitute merely exemplary embodiments. Persons skilled in the art may make various changes in the shape, size and arrangement of parts without departing from the scope of the disclosure. For example, persons skilled in the art may substitute equivalent elements for the elements illustrated and described. Moreover, persons skilled in the art may use certain features of the disclosed concepts independently of the use of other features, without departing from the scope of the disclosure.

The invention claimed is:

1. An apparatus, comprising:
   a radio-frequency (RF) circuit, comprising:
      a power amplifier coupled to receive an RF input signal, the RF input signal derived from an output signal of an intermediate frequency (IF) delay adjust circuit, and to provide an RF output signal in response to a modified bias signal; and
      a bias path circuit coupled to modify a bias signal as a function of a characteristic of an input signal to generate the modified bias signal, and to provide the modified bias signal to the power amplifier.

2. The apparatus according to claim 1, wherein the input signal is provided by an intermediate-frequency (IF)/RF path circuit.

3. The apparatus according to claim 1, wherein the characteristic of the input signal comprises an envelope, or an in-phase (I) or a quadrature (Q) level.

4. The apparatus according to claim 1, wherein the bias path circuit modifies the bias signal in an analog domain.

5. The apparatus according to claim 4, wherein the bias current is modified to linearize the power amplifier.

6. The apparatus according to claim 4, wherein the bias current is modified to improve an efficiency of the power amplifier.

7. The apparatus according to claim 1, wherein the bias path circuit modifies the bias signal in a digital domain.

8. The apparatus according to claim 7, wherein the bias current is modified to linearize the power amplifier.

9. The apparatus according to claim 7, wherein the bias current is modified to improve an efficiency of the power amplifier.

10. An apparatus, comprising:
    a radio-frequency (RF) circuit, comprising:
       a power amplifier coupled to receive an RF input signal, the RF input signal derived from an output signal of an intermediate frequency (IF) delay adjust circuit, and to provide an RF output signal;
       an intermediate-frequency (IF)/RF path circuit to receive an input signal and provide the RF input signal to the power amplifier; and
       a bias path circuit coupled to generate a bias signal as a function of the input signal, and to provide the bias signal to the power amplifier.

11. The apparatus according to claim 10, wherein the bias path circuit generates the bias signal in an analog domain.

12. The apparatus according to claim 11, wherein the bias path circuit comprises:
    a power calculation circuit to calculate a power of the input signal of the IF/RF path circuit and to generate an output signal;
    a bias delay adjust circuit to adjust a delay of the output signal of the power calculation circuit and to generate a delayed signal; and
    a look-up table (LUT) to receive the delayed signal and to generate an output signal as a function of the characteristic of the input signal.

13. The apparatus according to claim 10, wherein the bias path circuit modifies the bias signal in a digital domain.

14. The apparatus according to claim 13, wherein the bias path circuit comprises:
    a power calculation circuit to calculate a power of the input signal of the IF/RF path circuit and to generate an output signal;
    a bias delay adjust circuit to adjust a delay of the output signal of the power calculation circuit and to generate a delayed signal;
    a look-up table (LUT) to receive the delayed signal and to generate an output signal as a function of the characteristic of the input signal; and
    a segmented decoder to receive the output signal of the LUT and to generate and provide to the power amplifier a plurality of signals.

15. A method of operating a power amplifier, the method comprising:
    receiving an input signal;
    modifying a bias signal of the power amplifier as a function of a characteristic of the input signal to generate a modified bias signal;
    biasing the power amplifier using the modified bias signal; and
    amplifying, using the amplifier, an RF signal derived from the input signal, the RF signal derived from an output signal of an intermediate frequency (IF) delay adjust circuit.

16. The method according to claim 15, wherein the characteristic of the input signal in modifying the bias signal of the power amplifier as the function of the characteristic of the input signal to generate the modified bias signal comprises an envelope, or an in-phase (I) or a quadrature (Q) level.

17. The method according to claim 15, wherein modifying the bias signal of the power amplifier as the function of the characteristic of the input signal to generate the modified bias signal further comprises modifying the bias signal in an analog domain.

18. The method according to claim 15, wherein modifying the bias signal of the power amplifier as the function of the characteristic of the input signal to generate the modified bias signal further comprises modifying the bias signal in a digital domain.

19. The method according to claim 15, wherein modifying the bias signal of the power amplifier as the function of the characteristic of the input signal to generate the modified bias signal is performed to linearize the power amplifier.

20. The method according to claim 15, wherein modifying the bias signal of the power amplifier as the function of the characteristic of the input signal to generate the modified bias signal is performed to improve an efficiency of the power amplifier.

* * * * *